United States Patent
Petrucci et al.

(10) Patent No.: US 10,949,577 B2
(45) Date of Patent: Mar. 16, 2021

(54) INTELLIGENT ASSEMBLY FLIPPING IN REVIT

(71) Applicant: Applied Software Technology, Inc., Atlanta, GA (US)

(72) Inventors: Mark Petrucci, Atlanta, GA (US); Xiao Chun Yao, Marietta, GA (US)

(73) Assignee: Applied Software Technology, Inc., Atlanta, GA (US)

( * ) Notice: Subject to any disclaimer, the term of this patent is extended or adjusted under 35 U.S.C. 154(b) by 0 days.

(21) Appl. No.: 16/853,341

(22) Filed: Apr. 20, 2020

(65) Prior Publication Data

US 2020/0334387 A1     Oct. 22, 2020

Related U.S. Application Data

(60) Provisional application No. 62/835,668, filed on Apr. 18, 2019.

(51) Int. Cl.
*G06F 3/048*     (2013.01)
*G06F 30/12*     (2020.01)
*G06F 9/445*     (2018.01)
*G06F 3/0482*    (2013.01)
*G06F 3/0484*    (2013.01)

(52) U.S. Cl.
CPC .......... *G06F 30/12* (2020.01); *G06F 3/0482* (2013.01); *G06F 3/04845* (2013.01); *G06F 9/44526* (2013.01)

(58) Field of Classification Search
CPC ...... G06F 30/13; G06F 30/12; G06F 9/44526; G06F 3/0482; G06F 3/04845; Y10S 715/964
See application file for complete search history.

(56) References Cited

U.S. PATENT DOCUMENTS

2004/0113945 A1* 6/2004 Park ................. G06F 30/13
715/765
2007/0120714 A1* 5/2007 Beltran .............. G06F 30/00
341/106

OTHER PUBLICATIONS

Havard Vasshaug, Door Swing in Revit, (https://www.youtube.com/watch?v=9H4j_3lkQVE), attached screenshots as DoorSwinginRevit.pdf, 2014) (Year: 2014).*
Keith Wilkinson, How reliable is the data in your Revit model? (https://www.linkedin.com/pulse/how-reliable-data-your-bim-model-keith-wilkinson/), attached as pdf (Year: 2019).*

* cited by examiner

*Primary Examiner* — Alex Olshannikov
(74) *Attorney, Agent, or Firm* — Clayton, McKay & Bailey, PC

(57) ABSTRACT

Examples can include a system for flipping components in REVIT or other BIM software. A plugin can receive an indication that a flip has occurred in a plan displayed on a graphical user interface ("GUI"). The plan can include an assembly that has a handedness, such as a door or window. The plugin can determine what the handedness should be based on assembly parameters indicating mirroring, facing, and hand flipped. Because some assemblies cannot correctly mirror without adjusting handedness, the plugin can determine the appropriate handedness and replace the assembly with a different assembly when the handedness is incorrect after flipping. The new assembly can display in the GUI at the correct location.

20 Claims, 4 Drawing Sheets

INTELLIGENT ASSEMBLY FLIPPING IN REVIT

CROSS-REFERENCE TO RELATED APPLICATION

This application claims the benefit of and priority to U.S. Provisional Application No. 62/835,668, filed on Apr. 18, 2019, titled "INTELLIGENT ASSEMBLY FLIPPING IN REVIT," the contents of which are hereby incorporated herein by reference in their entirety.

BACKGROUND

Computer-aided design ("CAD") software allows users to design structures for construction, among other things. One type of CAD software is Building Information Modeling ("BIM") software, which allows users to elaborately design three-dimensional structures. AUTODESK REVIT is one type of BIM software that can be used to design complex buildings all the way down to components and assemblies for use in a project. For example, a user can model an entire plumbing or electrical installation within a building. Doors, windows, and other reversible components can also be laid out in REVIT.

REVIT can also mirror a room, such as if the same room is desired but in an opposite configuration. However, door swings, hot and cold assemblies, ducts with directional flow, and other reversible items can become incorrect when doing so, swinging, opening, or facing in the wrong direction in the mirrored plan. REVIT can track mirroring, hand flip, and facing flip features for components like doors and windows. Mirroring can indicate if a part is mirrored, facing flip indicates whether the facing has been flipped, and hand flip indicates if the handle is flipped. However, REVIT does not track left swing, right swing, flow direction, hot/cold, and other important directional properties.

When a plan is flipped, doors and windows can appear correct on the graphical user interface ("GUI"). However, the part family can still be the same one as the original plan. For example, a right swing door assembly with a flip applied can look correct but swing in the wrong direction. This can lead to incorrect orders and frustrations during the building process.

For at least these reasons, a need exists for systems that can intelligently flip components in REVIT.

SUMMARY

The examples described herein specifically address technical problems and limitations of REVIT and similar BIM software. The examples include a computing device, such as a personal computer, tablet, or laptop, that executes a computer-aided design application such as REVIT. The application can include an application programming interface ("API") that interacts with a plugin. The plugin can supply additional functionality regarding assembly flipping. The plugin can intelligently flip assemblies (parts, a collection of parts, or particular parts of the collection) used in REVIT or another BIM or CAD program that executes on the computing device.

When a user reverses a collection of components, such as an entire room in a layout, REVIT does not expose to the user whether handedness of particular assemblies has flipped. For example, a door may flip but it can be unclear to a user whether the handedness has also flipped. Worse, the graphics can appear flipped when the part itself is not, or vice versa.

In one example, the plugin can maintain a "Swing R/L" parameter (called "swing parameter" for convenience. The plugin can keep its own database of assemblies to which the swing parameter applies. Alternatively, the plugin can store handedness as metadata of component family instances called assemblies. By tracking the swing parameter, the plugin can determine when an assembly must be changed (either replaced or reconfigured) to match the correct handedness after some sort of flip has occurred within the BIM software.

In one example, the plugin can receive an indication that a flip action has occurred for an assembly in a GUI. A mirror, face flip, or hand flip function can cause the indication to be sent to the plugin, in an example. The plugin can then loop through assemblies in the design layout to determine if handedness applies. If it does, the plugin can select handedness for the assembly based on a combination of parameters for the assembly, including a mirrored parameter, facing flipped parameter, and a hand flip parameter. To set the swing parameter for an assembly, the plugin can use parameters of the original assembly to determine which handedness is appropriate within the flipped plan. These parameters can include Mirrored, Facing-Flipped, Hand-Flipped. These can allow the plugin to decide whether the assembly swings right or left. The plugin can access these parameters through an application programming interface ("API") in an example. The plugin can maintain a swing parameter through a parameter formula based on the three characteristics.

In one example, a right-hand handedness is selected when the assembly is not mirrored, is not facing flipped, and is not hand flipped. Likewise, a right-hand handedness can be selected when the assembly is not mirrored, is facing flipped, and is hand flipped. Conversely, a left-hand handedness can be selected when the assembly is mirrored, is not facing flipped, and is hand flipped. Similarly, a left-hand handedness can be selected when the assembly is mirrored, is facing flipped, and is not hand flipped.

The plugin can replace the assembly with another assembly if the selected handedness differs from the existing handedness. For example, a different assembly with left-handedness can be placed in the spot where the right-handed assembly was. To do this, the plugin can use API calls to replace the assembly with the corrected assembly. This can cause the replaced assembly to display in the GUI.

The plugin can include an application that scans the REVIT model and evaluates assemblies for the above-mentioned three parameters. Then the application can decide the swing parameter status and create the corresponding swing parameters or set the status value for the swing parameters if they exist already. In one example, the plugin creates the three parameters for the model. This can include maintaining these parameters when new components are added or when a status for an existing component is changed. The plugin can also add and maintain a family parameter called swing parameter (i.e., "Swing R/L") to be evaluated in the REVIT GUI from these three parameters. The plugin can independently track the swing parameter for each eligible component in the layout.

The method can be performed by a system in an example. The method can also be implemented based on code stored on a non-transitory, computer-readable medium, which is read and executed by a process of a computing device.

DESCRIPTION OF THE EXAMPLES

Reference will now be made in detail to the present examples, including examples illustrated in the accompanying drawings. Wherever possible, the same reference numbers will be used throughout the drawings to refer to the same or like parts.

A plugin can determine which assemblies are directional and ensure handedness remains correct when mirroring occurs within a design layout. One or more swing parameters can be tracked in metadata of assemblies. The swing parameter can track handedness, air flow direction, and hot and cold orientation, among others. The plugin can determine which assemblies no longer correlate to the original directionality or handedness based on flips or mirror functions applied by the user. This can save the user from inadvertently ordering the wrong parts, such as a right-handed door assembly that visually appears left-handed in the GUI based on a mirror or flip. Although handedness is used as an example, the same examples apply to directionality (e.g., airflow direction) and orientation (e.g., hot and cold).

Figure 1:
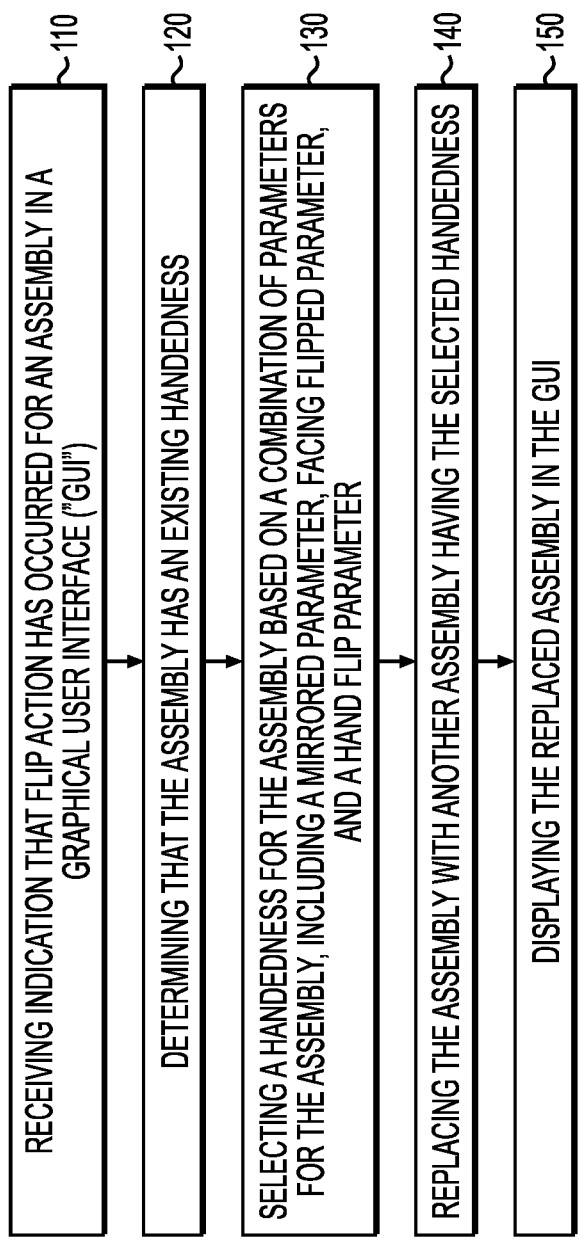
FIG. 1 is an example flow chart showing example stages for auto-dimensioning a part assembly in a computer-aided design application, such as REVIT.

FIG. 1 is an example illustration of method stages performed for correcting handedness for assemblies in a BIM program. In one example, a plugin can iterate through a REVIT model and perform various stages on a component, such as a door or window assembly. At stage 110, the plugin can receive an indication that a flip has occurred. This can be based on the user selecting a button to alert the plugin or can be based on some other API interaction. In one example, executing a flip function causes REVIT to send the indication to the plugin. In another example, the user simply selects a button to execute flip fixing, which can also indicate the flip has occurred.

At stage 120, the plugin can determine that the component has a handedness. This can include detecting a swing parameter that is part of the component or wrapped onto the component by the plugin. The plugin can add its own parameters to components in an example. Handedness or swing can indicate the direction that some portion of the component should swing. This may not be graphically illustrated in the REVIT GUI, but the handedness of a component can be an important item to have correct when ordering parts. Otherwise, for example, a door may open in the wrong direction.

At stage 130, the plugin can select the handedness based on the parameters for mirrored, facing flip, and hand flip. This can include setting the swing parameter. If the swing parameter has not appropriately changed based on the flipped plan, then the plugin can replace the component with a properly flipped on at stage 140.

The default assembly can be a right swing door, in an example. The user can place this door in multiple places in a layout. However, the user may apply a flip on one of the doors so that it will open the other way. Even though flip is applied and may even be visually correct, the assembly itself may still be a right swing door. The plugin, therefore, needs to determine which assemblies have been flipped and ensure that the assembly matches the new swing parameter (e.g., left swing or right swing).

In one example, a handedness swing parameter can be determined by Equation 1, below.

if(or(and(Mirrored,FacingFlipped),(and(Mirrored, HandFlipped))),"Left","Right")  Equation 1

Using this equation, if the part has been mirrored and flipped one way, then the swing parameter can be left-handed. Conversely, if no mirroring has occurred and either no flips or two flips (face flip and hand flip) have occurred, then the orientation is right-handed.

Replacing the component can include determining a like component with an opposite swing parameter. In one example, the plugin need only set the swing parameter. But in another example, the plugin can match the component against another component sharing the same parameters and values but having a correct swing parameter value. The new component can replace the prior one and display in the GUI at stage 150. In one example, this change is not visibly apparent in the GUI. For example, if the swing value is changed, the component may otherwise still look the same in the GUI. Conversely, the GUI can represent the swing in some examples.

Figure 2:
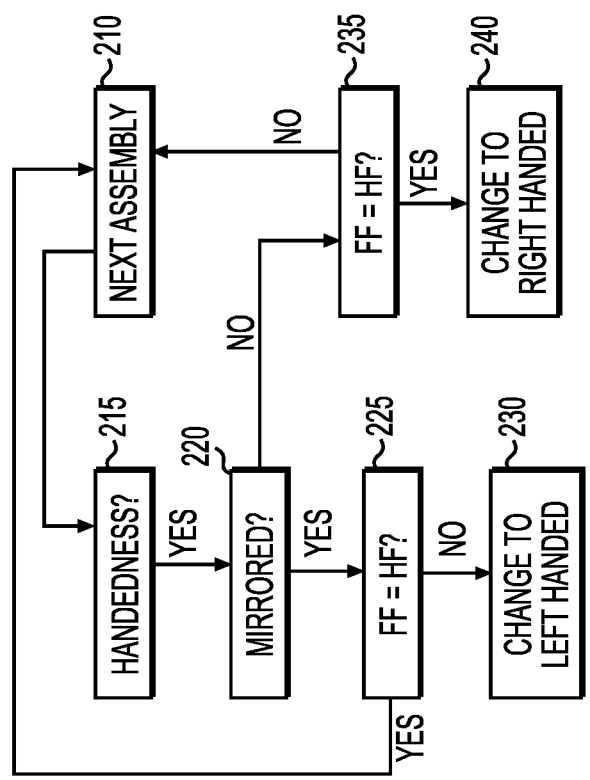
FIG. 2 is an example flow chart with steps for flipping assemblies in REVIT.

FIG. 2 is an example flowchart of stages performed for changing the directionality of a component, such as an assembly, that in a design layout in, for example, REVIT. The plugin can iterate through components in an example. At stage 210, the plugin can analyze a next assembly (next component). To determine whether swing is an issue, the plugin can attempt to determine if the component has a handedness at stage 215. Components with handedness can include windows, doors, and other assemblies that open and shut. Also, components with hookups that have handedness can be included. Although handedness is used here as an example, any swing parameter can be checked. The swing parameter can indicate handiness, directionality, or an ordered configuration.

Assemblies that are subject to directionality can be preset with a swing parameter, in an example. For example, the plugin can look for particular part identifiers that it recognizes as requiring handiness or some other directionality. In one example, the GUI can allow the user to select which assemblies have this quality. In another example, any assembly having the hand flip parameter is considered by the plugin to have handiness.

If the component does not have handedness, the plugin can begin analyzing the next assembly at stage 210. Otherwise, at stage 220 the plugin can check whether a parameter indicates the component is mirrored. This can include making an API call to the BIM software to receive a mirrored parameter value, which can be yes (or true) or no (or false).

If the mirrored value is yes, then additional checks can determine if the swing should be set to left-handed. For example, a value of a facing flipped (FF) parameter can be compared to a value of a hand flipped (HF) parameter at stage 225. If these values are not equal (e.g., one is true, and one is false) then the handedness (swing) is determined to be switched at stage 230. For a right-handed assembly, this means the assembly needs to be changed out for a left-handed version of that assembly. The plugin can do this either by changing the handedness attribute, in an example, or by substituting in a new component having the correct swing value. For example, the assembly might be configurable onsite to be either handedness, and the metadata can track which manner of assembly will be needed. Alternatively, if the assembly only works with a particular directionality, a different like-kind assembly with the other directionality can be selected by the plugin and substituted in for the original assembly. To select the new assembly, in one example, the plugin can expand a family that the assembly belongs to and locate another assembly at the same level of the family hierarchy. The other assembly can share a root name with the first assembly but can have a swing parameter with an opposite (or different) value from the original assembly.

The plugin can make the switch within the GUI by calling an API command to get the location of the first assembly. Then the plugin can remove the first assembly with a different API command. Finally, the plugin can issue a third API command to add the replacement assembly at the location previously retrieved for the first assembly. This can cause a like-kind assembly to appear on the GUI screen, except the replacement assembly can have a different swing parameter value. The replacement assembly can be used in the ordering process to order the correct parts from a directionality perspective.

Otherwise, if the face flip and hand flip are the same at stage 225 (both yes or both no) the plugin can move to the next component at stage 210.

If the mirrored value is no or false at stage 220, then additional checks can occur at stage 235. For example, if the value of the face flipped parameter equals the value of the hand flipped parameter (both yes or both no), then the swing parameter can be maintained as unchanged. In this example, that means the swing parameter is right-handed. The plugin can change the swing value or substitute a new component having the correct sing value. Otherwise the plugin can move to the next component at stage 210.

In one example, to switch the swing direction, the mirrored parameter needs to be yes and one of the face flipped or hand flipped needs to be yes, but not both. Stages 220, 225, 235 can operate in this manner. In one example, the plugin makes API calls to retrieve parameter values for the three parameters: Mirrored, FacingFlipped, and HandFlipped. In one example, a component cannot just be mirrored. In that example, the mirrored parameter cannot be YES (i.e., True) without one other parameter set to YES. In one example, if a family is Mirrored it must also be FacingFlipped OR HandFlipped but not both.

The following IF THEN statements of Table 1 can be used for checking the direction of a component family, such as at stages 220, 225, and 235:

IF (Mirrored=NO) and (FacingFlipped=NO) and (HandFlipped=NO) THEN Right Hand
IF (Mirrored=NO) and (FacingFlipped=YES) and (HandFlipped=YES) THEN Right Hand
IF (Mirrored=YES) and (FacingFlipped=NO) and (HandFlipped=YES) THEN Left Hand
IF (Mirrored=YES) and (FacingFlipped=YES) and (HandFlipped=NO) THEN Left Hand Table 1

In summary, in REVIT there are three parameters that indicate if an assembly is facing in a different direction then originally intended. Those parameters are mirrored (stage 220), facing flipped (stages 225, 230), and hand flipped (stages 225, 230). In most BIM applications, such as REVIT, a component family that is mirrored must also have at least one of the flip parameters set to yes. This is because to mirror the assembly, at least one of those types of flips must have occurred. So, if an assembly is mirrored it must also be facing flipped or hand flipped but not both, in an example.

This process can repeat until all of the components in the model have been analyzed, in an example. Alternatively, the process can be run for a subset of components selected on the GUI by the user.

The plugin can analyze components on a one-off basis, such as if the user would like to confirm handedness. Alternatively, the plugin can scan the entire layout when a flip operation occurs. The flip operation can have a hook that calls a procedure at the plugin, causing the plugin to automatically check handedness.

Figure 3:
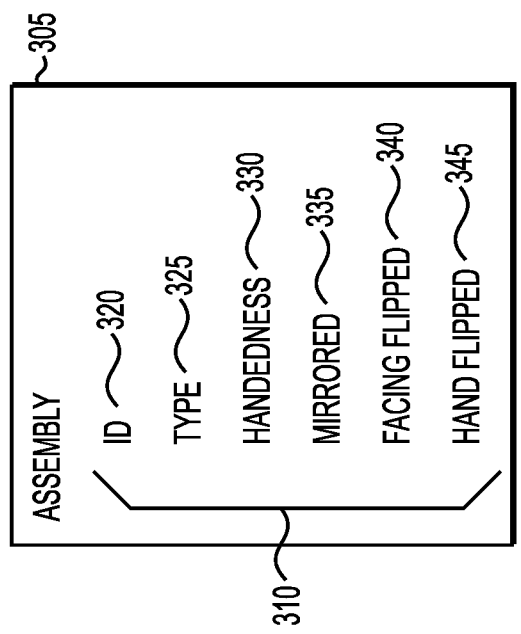
FIG. 3 is an example illustration of assembly parameters.

FIG. 3 is an illustration of example parameter values utilized by the plugin. The assembly 305 can have multiple parameters 310, some of which are shown here. The assembly can have an identifier 320 that the plugin can use to refer to additional parameters that are tracked outside of REVIT in an example. This can include handedness 330 or another swing parameter in an example. The plugin can maintain a database of parameter values or can rely on REVIT's database, depending on the example. For example, the assembly 305 record can be a combination of REVIT and plugin values in an example. Alternatively, the handedness 330 can be stored in REVIT as metadata for the assembly 305, in an example.

The type parameter 325 can indicate a type of assembly. The plugin can limit its operation to certain assembly types in an example. For example, when the type 325 is a door or window, the plugin can look for handedness. If the type 325 is a duct, the plugin can look for airflow directionality. Other swing parameters can be checked in this way.

The handedness 350 (also called swing) can indicate which direction some portion of the assembly swings. As has been discussed, handedness for a door, window, or cabinet can be left-handed or right-handed. This can indicate which direction the door swings open.

The mirrored parameter 335 can indicate whether the assembly is mirrored. This value can be set when REVIT applies a mirroring command to the assembly or a room that the assembly is within.

The facing flipped parameter 340 can indicate if the door has been flipped. Flipping the facing is one way to mirror an assembly.

Then, the hand flipped parameter 345 can indicate whether the handle has been flipped. Flipping the handle location is another thing that can happen during mirroring.

Figure 4:
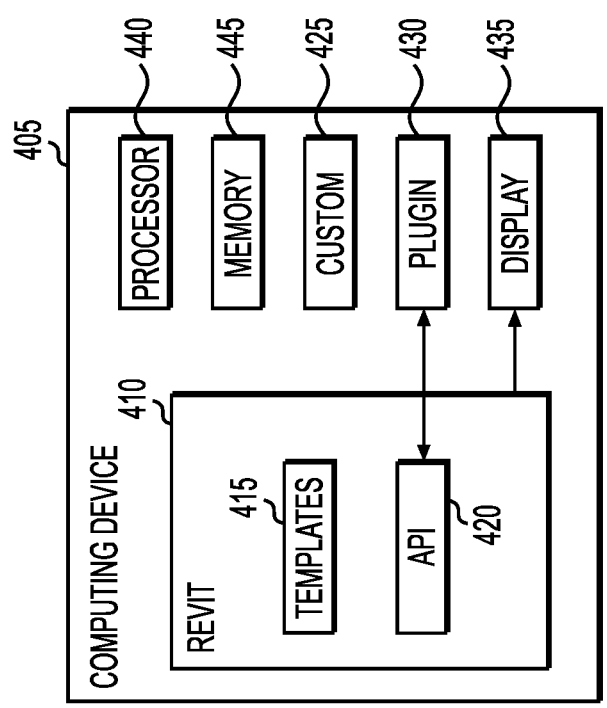
FIG. 4 is an example illustration of system components.

FIG. 4 is an illustration of example system components. The computing device 405 can be any processor-based device, such as a personal computer, workstation, server, phone, or laptop. The computing device 405 can include a processor 440 and memory 445. The processor 440 can be one or more physical processors that are local to the computing device 405 or virtual computer processing units that are accessed remotely. The memory 445 can be non-transitory and can store instructions for execution by the processor 445.

The processor 440 can run a computer-aided design application, such as REVIT 410. REVIT 410 can include templates 415 for parts and part assemblies. These can be generic parts and assemblies. Alternatively, custom parts and assemblies 425 can be utilized.

REVIT 440 can also generate a GUI for use with a display 435. The display 435 can be any type of screen and can be integrated into the computing device 405 or separate from the computing device 405.

REVIT 440 can utilize the plugin 430 to add functionality. The plugin 430 can make API 420 calls to REVIT to integrate itself within the workflow. This can include altering the GUI and providing additional functional items, such as menu items and buttons, for use with the auto-dimensioning. The plugin 430 can receive information, such as part identifiers, from REVIT 410, and send back dimensional information.

The plugin 430 can also use the API to track directional parameters for assemblies. The directional characteristics can change based on flip and mirror commands within REVIT 410. The plugin 430 can have various equations for determining how flip and mirror values for an assembly dictate the handedness or other directional orientation. The plugin 430 can compare the expected handedness or other directionality to the original. If they are different, the plugin 430 can make API calls to switch the original assembly out for a replacement with the updated directionality (e.g., handedness). This can include getting and storing the location and orientation of the original assembly. Then, using this location and orientation, adding the replacement assembly with one or more API calls.

In one example, the plugin 430 accesses swing rules to determine which way assemblies swing under different flip and mirror circumstances. The swing rules can be keyed to part or assembly types in an example. The type can be retrieved by the plugin for a given assembly. A database, either local or remote from the computing device 405, can store the swing rules and be accessed by the plugin 430.

In one example, a flipper engine can perform the various stages performed by the plugin. The flipper engine can interpret the swing rules, measure dimensions, and highlight assemblies that appear to not support the current flip or mirror orientation. The user can then accept replacements. The plugin can make the replacements as described above.

This can ensure that the assemblies in a design layout actually correspond to the correct directionality for assemblies that a user orders. This can help ensure that doors and windows open correctly when installed, that hot and cold-water intake is correct, and that air flows in the correct direction through ductwork.

Although a plugin is described in some examples, the computer-aided application, such as REVIT, can alternatively build the described functionality directly into the application. The examples can still apply to that scenario as well. Additionally, though REVIT is referred to for convenience, the examples can also function with any other computer-aided design application.

Other examples of the invention will be apparent to those skilled in the art from consideration of the specification and practice of the examples disclosed herein. Though some of the described methods have been presented as a series of steps, it should be appreciated that one or more steps can occur simultaneously, in an overlapping fashion, or in a different order. The order of steps presented are only illustrative of the possibilities and those steps can be executed or performed in any suitable fashion. Moreover, the various features of the examples described here are not mutually exclusive. Rather any feature of any example described here can be incorporated into any other suitable example. It is intended that the specification and examples be considered as exemplary only, with a true scope and spirit of the invention being indicated by the following claims.

What is claimed is:

1. A method for intelligent component flipping in a computer-aided design ("CAD") application, comprising:

receiving, at a plugin, indication that a flip action has occurred in a graphical user interface ("GUI");

determining, by the plugin, that an assembly within the GUI has an existing handedness, including checking a swing parameter for the assembly that requires a preset handedness, wherein the swing parameter is checked as part of iterating through multiple components in the GUI in response to the flip action;

selecting a handedness for the assembly based on a combination of parameters for the assembly, including a mirrored parameter, facing flipped parameter, and a hand flip parameter;

replacing, by the plugin, the assembly with a replacement assembly if the selected handedness differs from the existing handedness of the assembly, wherein the plugin makes an application programming interface ("API") call to the CAD application to specify the replacement assembly; and displaying the replacement assembly in the GUI, wherein the replacement assembly has a correct handedness in relation to the flip action.

2. The method of claim 1, wherein a right-hand handedness is selected when the assembly is not mirrored, is not facing flipped, and is not hand flipped, wherein the swing parameter is added to the assembly by the plugin, and wherein the API call occurs when the existing handedness is left-hand.

3. The method of claim 1, wherein a right-hand handedness is selected when the assembly is not mirrored, is facing flipped, and is hand flipped, and wherein the API call occurs when the existing handedness is left-hand.

4. The method of claim 1, wherein a left-hand handedness is selected when the assembly is mirrored, is not facing flipped, and is hand flipped, and wherein the API call occurs when the existing handedness is right-hand.

5. The method of claim 1, wherein a left-hand handedness is selected when the assembly is mirrored, is facing flipped, and is not hand flipped, and wherein the API call occurs when the existing handedness is right-hand.

6. The method of claim 1, wherein the assembly is a first door assembly within a family, and wherein the plugin replaces the first door assembly including by identifying a second door assembly within the family that has an opposite handedness compared to the first door assembly, and wherein the first door assembly has a different swing parameter value than the second door assembly.

7. The method of claim 1, wherein the assembly is a window assembly, wherein the plugin adds a swing parameter to first and second window assemblies within a same part family, and wherein the swing parameter has a different value for the first and second window assemblies that the plugin uses to determine the replacement assembly.

8. A non-transitory, computer-readable medium containing instructions for intelligent component flipping in a computer-aided design ("CAD") application, wherein a processor executes the instructions to perform stages comprising:

determining, by a plugin, that the assembly has an existing handedness, including checking a swing parameter for the assembly that requires a preset handedness, wherein the swing parameter is checked by the plugin as part of iterating through multiple components in the GUI that were subject to a flip action;

selecting a handedness for the assembly based on a combination of parameters for the assembly, including a mirrored parameter, facing flipped parameter, and a hand flip parameter;

replacing, by the plugin, the assembly with a replacement assembly if the selected handedness differs from the existing handedness of the assembly, wherein the plugin makes an application programming interface ("API") call to the CAD application to specify the replacement assembly; and displaying the replacement assembly in the GUI, wherein the replacement assembly has a correct handedness in relation to the flip action.

9. The non-transitory, computer-readable medium of claim 8, wherein a right-hand handedness is selected when the assembly is not mirrored, is not facing flipped, and is not hand flipped, wherein the swing parameter is added to the assembly by the plugin, and wherein the API call occurs when the existing handedness is left-hand.

10. The non-transitory, computer-readable medium of claim 8, wherein a right-hand handedness is selected when the assembly is not mirrored, is facing flipped, and is hand flipped, and wherein the API call occurs when the existing handedness is left-hand.

11. The non-transitory, computer-readable medium of claim 8, wherein a left-hand handedness is selected when the assembly is mirrored, is not facing flipped, and is hand flipped, and wherein the API call occurs when the existing handedness is right-hand.

12. The non-transitory, computer-readable medium of claim 8, wherein a left-hand handedness is selected when the assembly is mirrored, is facing flipped, and is not hand flipped, wherein the API call occurs when the existing handedness is right-hand.

13. The non-transitory, computer-readable medium of claim 8, wherein the assembly is a first door assembly within a family, and wherein the plugin replaces the first door assembly including by identifying a second door assembly within the family that has an opposite handedness compared to the first door assembly, and wherein the first door assembly has a different swing parameter value than the second door assembly.

14. The non-transitory, computer-readable medium of claim 8, wherein the assembly is a window assembly, wherein the plugin adds a swing parameter to first and second window assemblies within a same part family, and wherein the swing parameter has a different value for the first and second window assemblies that the plugin uses to determine the replacement assembly.

15. A system for intelligent component flipping in a computer-aided design ("CAD") application, comprising:

a processor that executes instructions for running the CAD application, the CAD application having an application programming interface ("API");

a memory that includes code for a plugin, the plugin interacting with the API to cause the processor to perform stages including:

determining, by a plugin, that the assembly has an existing handedness, including checking a swing parameter for the assembly that requires a preset handedness, wherein the swing parameter is checked by the plugin as part of iterating through multiple components in the GUI that were subject to a flip action;

selecting a handedness for the assembly based on a combination of parameters for the assembly, including a mirrored parameter, facing flipped parameter, and a hand flip parameter;

replacing the assembly with assembly if the selected handedness differs from the existing handedness of the assembly; and displaying the replaced assembly in the GUI.

16. The system of claim 15, wherein a right-hand handedness is selected when the assembly is not mirrored, is not facing flipped, and is not hand flipped, wherein the mirrored parameter is added to the assembly by the plugin and determined based on the facing flipped and hand flip parameters, and wherein the API call occurs when the existing handedness is left-hand.

17. The system of claim 15, wherein a right-hand handedness is selected when the assembly is not mirrored, is facing flipped, and is hand flipped, and wherein the API call occurs when the existing handedness is left-hand.

18. The system of claim 15, wherein a left-hand handedness is selected when the assembly is mirrored, is not facing flipped, and is hand flipped, and wherein the API call occurs when the existing handedness is right-hand.

19. The system of claim 15, wherein a left-hand handedness is selected when the assembly is mirrored, is facing flipped, and is not hand flipped, and wherein the API call occurs when the existing handedness is right-hand.

20. The system of claim 15, wherein the assembly is a first door assembly within a family, and wherein the plugin replaces the first door assembly including by identifying a second door assembly within the family that has an opposite handedness compared to the first door assembly, and wherein the first door assembly has a different swing parameter value than the second door assembly.

* * * * *